United States Patent [19]
Crawford

[11] 3,778,688
[45] Dec. 11, 1973

[54] MOS-BIPOLAR HIGH VOLTAGE DRIVER CIRCUIT

[75] Inventor: Robert Hudson Crawford, Richardson, Tex.

[73] Assignee: Texas Instruments Incorporated, Dallas, Tex.

[22] Filed: Mar. 15, 1971

[21] Appl. No.: 124,436

Related U.S. Application Data

[63] Continuation of Ser. No. 758,253, Sept. 9, 1968, abandoned.

[52] U.S. Cl.... 317/235 G, 317/235 X, 340/347 DD
[51] Int. Cl. .............................................. H01l 11/00
[58] Field of Search..................... 317/235 G, 235 X, 317/ 234 Y; 307/279, 205, 213, 251, 303, 304; 340/347 DD

[56] References Cited

UNITED STATES PATENTS

| | | | |
|---|---|---|---|
| 3,440,502 | 4/1969 | Lin et al. | 317/235 |
| 3,609,479 | 9/1971 | Hung Chang Lin | 317/235 Y |

*Primary Examiner*—Charles D. Miller
*Attorney*—Gary C. Honeycutt

[57] ABSTRACT

A monolithic circuit for driving a high voltage numerical readout device such as a NIXIE tube is described which has a driver circuit for each numerical output that includes an NPN bipolar transistor and a p-channel enhancement mode field effect transistor for controlling the emitter current of the bipolar transistor. A four bit binary-to-decimal decoder formed by p-channel MOSFETs control the gate voltages of the MOSFETs of each driver circuit. The MOSFETs of both the logic circuit and the driver circuits are formed by p-type diffusions in an n-type epitaxial region grown in a p-type substrate, while the bipolar transistors are formed by n-type diffusions in the p-type substrate. The bipolar transistors include an inversion preventing electrode over the base region and an n-type diffused guard ring. The integrated circuit also includes a voltage controllable multivibrator for duty cycle modulating the drive current to control the degree of illumination of the numerical readout.

9 Claims, 5 Drawing Figures

3,778,688

| | 0 | 1 | 2 | 3 | 4 | 5 | 6 | 7 | 8 | 9 |
|---|---|---|---|---|---|---|---|---|---|---|
| D | 1 | 0 | 0 | 0 | 1 | 0 | 1 | 0 | 1 | 0 |
| C | 1 | 0 | 0 | 1 | 1 | 0 | 0 | 1 | 1 | 0 |
| B | 0 | 1 | 1 | 1 | 1 | 0 | 0 | 0 | 0 | 1 |
| A | 0 | 0 | 0 | 0 | 0 | 1 | 1 | 1 | 1 | 1 |

INVENTOR:

ROBERT H. CRAWFORD

E. Mickey Hubbard

ATTORNEY

INVENTOR:

ROBERT H. CRAWFORD

E. Mickey Hubbard

ATTORNEY

MOS-BIPOLAR HIGH VOLTAGE DRIVER CIRCUIT

This application is a continuation of application Ser. No. 758,253, filed Sept. 9, 1968 now abandoned.

This invention relates generally to semiconductor devices, and more particularly relates to metal-oxide-semiconductor (MOS) field effect transistor integrated circuits.

A limiting factor in the use of metal-oxide-semiconductor field effect transistor (MOSFET) integrated circuit arrays is the relatively low output voltage which can be produced because of the relatively low breakdown voltages of the MOS transistors. For example, an alphanumeric or binary-to-decimal decoder is readily attainable using a monolithic MOSFET logic circuit. However, the output voltage of these circuits is typically about −12.0 volts. Most alphanumeric readout devices, such as a NIXIE tube, require about +150 volts for optimum operation. Accordingly, an important aspect of the invention is to provide a means for interfacing between the relatively low voltage MOSFET circuits and the much higher voltage devices in order to utilize the many advantages of MOSFET logic circuits.

This invention is concerned generally with the use of a bipolar transistor in combination with a field effect transistor to control a high voltage used to drive a load. More specifically, the bipolar transistor is connected in common base configuration and the MOS transistor used to control the emitter current. The bipolar device can be a discrete device, or more importantly can be incorporated on the same monolithic semiconductor chip with MOSFET logic circuitry. In the particular embodiment illustrated, a monolithic integrated circuit is provided for decoding a binary input and directly driving a high voltage alphanumeric readout device, such as a NIXIE tube. The circuit also includes a means for duty cycle modulating the output voltage to control the degree of illumination of the readout device.

The novel features believed characteristic of this invention are set forth in the appended claims. The invention itself, however, as well as other objects and advantages thereof, may best be understood by reference to the following detailed description of an illustrative embodiment, when read in conjunction with the accompanying drawings, wherein:

Figures 1, 2:
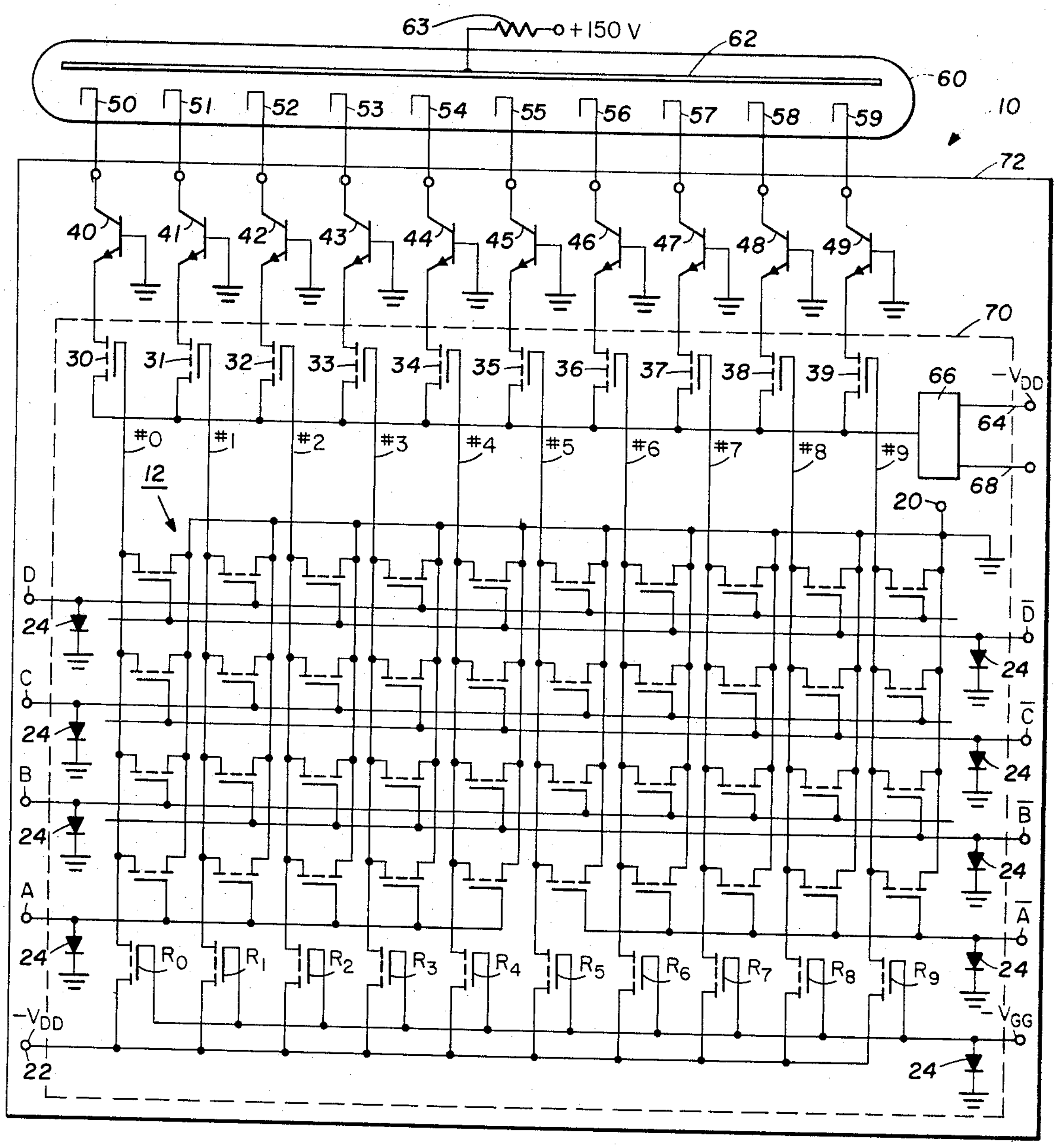
FIG. 1 is a schematic circuit diagram of a device constructed in accordance with the present invention.
FIG. 2 is a truth table which serves to illustrate the operation of a portion of the decoder section of the device of FIG. 1.

Referring now to the drawings, a device in accordance with the present invention is indicated generally by the reference numeral 10 in the schematic drawing of FIG. 1. The device 10 includes a binary-to-decimal decoding section, indicated generally by the reference numeral 12, which may be identical to that disclosed and claimed in copending U.S. application Ser. No. 567,495 now U.S. Pat. No. 3,541,543. The decoder 12 has true binary inputs A, B, C and D, complement binary inputs A, B, C and D, and 10 decimal outputs No. 0–No. 9.

The binary-to-decimal decoding section 12 is comprised of a plurality of enhancement mode, p-channel MOSFET transistors which are arrayed in eight binary input rows, one for each logic input, and 10 decimal output rows. In FIG. 1, however, it is convenient to show the input rows for logic inputs A and A in a single row, the transistors in the input rows for logic inputs B and B in a single row, the transistors in the input rows for logic inputs C and C in a single row, and the transistors in the input rows for logic inputs D and D in a single row. The gates of the transistors in each of the eight binary input rows are common, and the eight sets of common gates form the eight binary inputs A, B, C and D, and A, B, C and D.

The drains of the transistors in each of the 10 decimal output rows are common and form the decimal outputs No. 0–No. 9. The common drains No. 0–No. 9 are connected to a drain supply voltage terminal 22 by MOS transistors $R_0$–$R_9$, respectively. The gates of transistors $R_0$–$R_9$ are common and are connected to a reference voltage supply terminal $-V_{GG}$ so that the transistors will provide a substantially constant resistance for producing an output voltage. The sources of all the transistors in the array are common and connected to a source terminal 20.

Each decimal output row has four transistors, which are located in the eight binary input rows in a manner to achieve decoding. When a logic 0, typically about ground potential, is applied to the base of all four transistors in a given decimal output row, the transistors are turned "off" and the output goes to a logic 1 level, which approaches the negative drain voltage. If the gate of any one of the transistors in the output row is a logic 1, which is a negative voltage, that transistor is turned "on" and the decimal output goes to a logic 0 level of approximately ground potential.

The decoder section 12 is connected so as to utilize the excess three binary code as set forth in the truth table shown in FIG. 2. Thus, the gates of the four transistors in decimal output row No. 0 are connected to inputs A, B, C and D. The gates of the transistors in decimal output row No. 1 are connected to inputs A, B, C and D. The gates of the transistors in output row No. 2 are connected to inputs A, B, C and D. The gates of the transistors in output row No. 3 are connected to inputs A, B, C and D. The gates of the transistors in output row No. 4 are connected to inputs A, B, C and D. The gates of the transistors in output row No. 5 are connected to inputs A, B, C and D. The gates of the transistors in output row No. 6 are connected to inputs A, B, C and D. The gates of the transistors in output row No. 7 are connected to inputs A, B, C and D. The gates of the transistors in output row No. 8 are connected to inputs A, B, C and D, and the gates of the transistors in output row No. 9 are connected to inputs A, B, C and D. Each of the true and complement inputs is connected to ground by a reverse biased field plate diode 24 to protect the various transistor gate dielectrics against static over voltage.

The decimal outputs No. 0–No. 9 are connected to the gates of MOS transistors 30–39, respectively. The sources of the MOS transistors 30–39 are connected to the emitters of bipolar transistors 40–49, respectively. The bases of transistors 40–49 are common, and are connected to ground, while the collectors are connected to cathodes 50–59 of a numerical readout device 60. The numerical readout device 60 will typically be a NIXIE tube in which the cathodes 50–59 are small diameter wires shaped like the numerals 0–9, respectively, and superimposed one over the other. The plate 62 of the tube 60 is typically connected to a positive voltage supply on the order of 150 volts through a large resistor 63. The drains of the MOS transistors 30–39 are common and are connected to a negative voltage supply 64 through a multivibrator 66, the frequency of which is controlled by a variable voltage applied at terminal 68. The multivibrator 66 is preferably fabricated utilizing MOS transistors and may be an Esclese-Jorden type voltage controllable astable flip-flop, or any other suitable circuit.

In the operation of the device 10, binary logic information is applied to true inputs A–D, and the complements of the logic information applied to the logic inputs A–D. As a result of these inputs, one of the logic outputs No. 0–No. 9 goes to a negative potential while the other nine remain at substantially ground potential. For example, if the binary number applied to the logic inputs represents numerical zero, output No. 0 is at a negative voltage approximating the voltage of the drain supply voltage $-V_{DD}$. This turns MOS transistor 30 "on" which supplies emitter drive current for bipolar transistor 40. Current then flows in the circuit including the positive voltage supply, plate 62, cathode 50, bipolar transistor 40, MOS transistor 30, multivibrator 66, and the negative drain supply voltage 64. The multivibrator 66 provides duty cycle modulation of the current in this circuit so that the level of illumination of the glowing cathode 50 will be proportional to the voltage applied to control input terminal 68.

Figure 3:
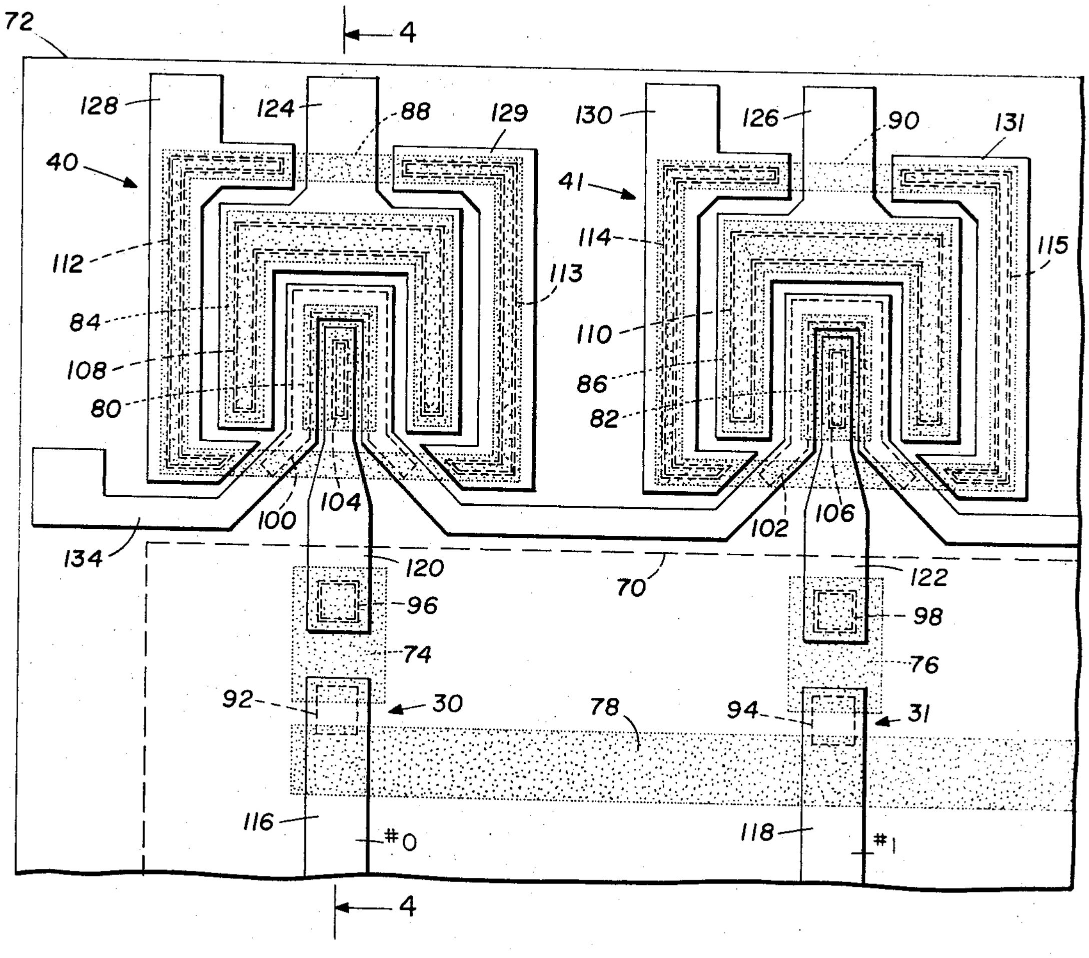
FIG. 3 is a simplified plan view of a portion of a monolithic embodiment of the circuit of FIG. 1.
Figure 4:
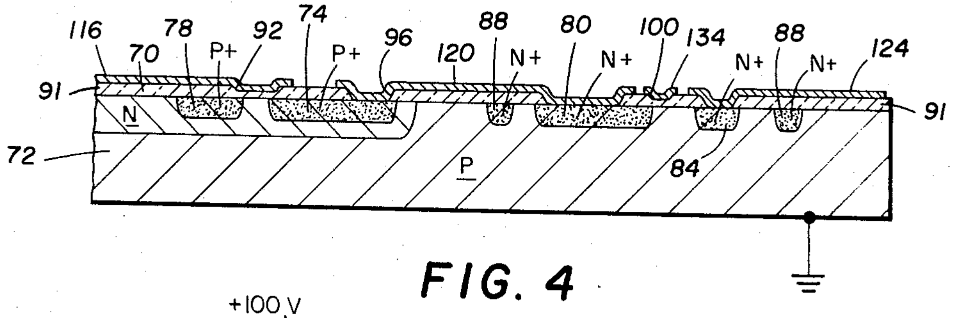
FIG. 4 is a simplified sectional view taken substantially on lines 4—4 of FIG. 3.

In accordance with an important aspect of the invention, the entire circuitry illustrated in FIG. 1, or any selected part thereof, is fabricated on a single monolithic semiconductor chip. This is achieved by forming all of the MOS transistors in an n-type epitaxial region, defined by the dotted outline 70 in FIG. 1, within a p-type substrate 72, and forming the NPN bipolar driver transistors 40–49 in the p-type substrate. The binary-to-decimal decoder 12 may be fabricated exactly as described in detail in the above-referenced copending application. The bipolar transistors 40–49 and the control MOS transistors 30–39 may be fabricated as illustrated in FIGS. 3 and 4, wherein only MOS transistors 30 and 31 and bipolar transistors 40 and 41 are illustrated by way of example.

First, a high resistivity n-type region 70 is formed in a high resistivity p-type substrate 72 by a conventional selective etch and epitaxial refill process. For example, the process described in U.S. Pat. No. 3,370,995, issued Feb. 27, 1968. The substrate is then subjected to one conventional p-type diffusion to form all of the MOS devices, and to one conventional n-type diffusion to form all of the bipolar devices. For example, heavily doped p-type diffused regions 74 and 76 form the sources of transistors 30 and 31, and a single p-type diffusion 78 forms the common drain for transistors 30–39. N-type diffusions 80 and 82 form the emitter regions of bipolar transistors 40 and 41, and n-type diffused regions 84 and 86 form the collector regions. N-type guard rings 88 and 90 may be diffused at the same time.

Oxide layers are then grown over the surface of the substrate and patterned in a conventional manner to leave an oxide layer 91 having thin areas 92 and 94 which form the control gate regions for MOS transistors 30 and 31, as indicated by the single dotted outline. The oxide layer is completely removed in the areas 96 and 98 outlined by a double dotted line to permit contact with diffused regions 74 and 76. The oxide is also made thin in areas 100 and 102 around the emitter diffusions 80 and 82 of the bipolar transistors, and the oxide is completely removed in areas 104 and 106 to permit contact with the emitter regions and in areas 108 and 110 to permit contact with the collector regions of the bipolar transistors. In addition, the oxide is removed in areas 112–115 over the guard ring diffusions 88 and 90.

A metal film is then deposited over the top of the substrate and patterned to leave metal strips 116 and 118 which form the control gates for MOS transistors 30 and 31, and which are connected to the logic outputs No. 0 and No. 1 of the decoder 12. Metallized strips 120 and 122 interconnect the emitters of transistors 40 and 41 and the source diffusions 74 and 76 of transistors 30 and 31, respectively. Metallized films 124 and 126 form the collector contacts for transistors 40 and 41 and provide output contacts for connection to the numerical display tube 60. Metallized strips 128–131 contact the guard ring diffusions 88 and 90. An inversion preventing electrode 134 extends over the thin oxide areas 100 and 102 around the edge of the emitter for purposes which will presently be described.

Figure 5:
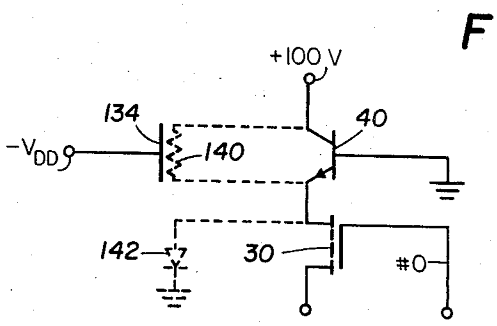
FIG. 5 is a simplified circuit diagram which serves to illustrate the operation of the driver section of the device of FIG. 4.

FIG. 5 is the equivalent circuit of the combination of bipolar transistor 40 and MOS transistor 30. Since the p-type substrate 72 which forms the base region of transistor 40 is lightly doped, the oxide overlaying the base region between the diffused emitter and collector regions will sometimes induce an n-type surface inversion channel which will form a leakage path between the diffused collector and emitter regions. This leakage path is represented by resistor 140. This leakage path together with the diode 142 formed by p-type diffused region 74 and the n-type epitaxial region 70 provides a current path which may be sufficient under some circumstances to produce an undesirable background glow in the numerals of the display device which are not actuated. The electrode 134 is connected to a negative voltage $-V_{DD}$ so as to insure that the n-type inversion layer does not occur. The guard rings 88 and 90 are connected to ground or a negative potential through metallized strips 128 and 130 to collect any carriers which may be injected into the p-type substrate 72 which might otherwise interfere with the operation of either the bipolar or MOS transistors in the remainder of the circuit.

From the above description of a preferred embodiment of the invention, it will be appreciated that a novel driver circuit has been described by which a high positive voltage can be controlled using a low negative output voltage from an MOS logic circuit. Within the broader aspects of the invention, the bipolar output transistor can be a discrete device in a separate package, or may be included in the same package with the MOS logic circuit. The bipolar transistors may be a conventional vertically oriented device, but the use of a surface oriented or lateral device provides a high output voltage and is very simple to fabricate. Another important advantage is that the driver device can be incorporated on the same monolithic substrate with the MOS logic circuitry. It should also be understood that within the broader aspects of the invention, any desired MOS logic circuitry can be used to control the output stage. The specific combination of a binary decoder and numerical display driver has particular utility, especially when combined with the duty cycle modulation capability.

Although a preferred embodiment of the invention has been described in detail, it is to be understood that various changes, substitutions and alterations can be made therein without departing from the spirit and scope of the invention as defined by the appended claims.

What is claimed is:

1. A circuit comprising a plurality of bipolar transistors and a plurality of MOS transistors, said bipolar transistors and said MOS transistors being formed in a common substrate with a common strip-like doped region forming the drain junctions and associated drain terminals of said MOS transistors with said drain terminals being connected in common with each other by portions of said strip-like region, and portions of said common substrate forming the base regions of said plurality of bipolar transistors with the base terminals of said bipolar transistors being connected in common with each other by portions of said substrate, and electrically conductive patterns interconnecting said MOS and said bipolar transistors to form a display driver circuit.

2. The circuit according to claim 1 and further including a display readout means responsive to said bipolar transistors.

3. A display circuit comprising a semiconductor body having a first substrate region of one conductivity type and a second substrate region of opposite conductivity type, a plurality of MOS transistors in said first substrate region, and a plurality of bipolar transistors in said second substrate region, said plurality of MOS transistors including a low resistivity strip-like region of said opposite conductivity type forming the drain regions and a common interconnection therebetween, said plurality of bipolar transistors including base regions comprised of portions of said second substrate region, and a pattern of conductive leads selectively interconnecting said MOS and said bipolar transistors.

4. The circuit according to claim 3 and further including a display readout means responsive to said bipolar transistors.

5. A display driver circuit comprising a semiconductor substrate having first and second contiguous regions of opposite conductivity type with portions of each of said regions extending to at least one surface of said substrate, said first region having formed therein a plurality of MOS transistors with the drain junction being formed and the drain of each of said MOS transistors being interconnected to each other by a third region of low resistivity semiconductor material, said third region of semiconductor material having a conductivity type opposite the conductivity type of said first region, said second region of said substrate having formed therein a plurality of non-contiguous regions having a conductivity type opposite of said second region with selected members of said non-contiguous regions in conjunction with selected portions of said second region forming a plurality of bipolar transistors with the base terminals of said plurality of bipolar transistors being connected in common by said second region of said substrate, said plurality of MOS transistors and said plurality of bipolar transistors being interconnected to each other to form a display driver by a patterned electrically conductive layer selectively formed on and selectively insulated from the surface of said substrate.

6. An integrated circuit for driving display devices, comprising in combination:

a. a semiconductor substrate having a first region having P conductivity type which extends to the top and bottom surfaces of said substrate and a second region having N conductivity type which extends to at least one surface of said substrate;

b. an elongated strip-like region of semiconductor material having P+ conductivity type extending to the surface of said substrate and within said second region having N conductivity type;

c. a plurality of substantially rectangular regions of semiconductor material having P+ conductivity type and disposed adjacent said strip-like region and extending to the surface of said substrate;

d. a plurality of regions of semiconductor material within said region of P conductivity type, said plurality of regions having N+ conductivity type and extending to one surface of said substrate;

e. a thin insulating layer selectively covering the surface of said substrate;

f. a pattern of electrically conductive leads covering said insulating layers and said substrate; wherein g. said strip-like regions of semiconductor material having P+ conductivity type in conjunction with said substantially rectangular regions of semiconductor material having P+ conductivity type and portions of said insulating layer and portions of said conductive pattern form a plurality of MOS transistors with the source terminals of said MOS transistors connected in common; and wherein h. said regions of N+ conductivity type in conjunction with portions of said insulating layer and portions of said conductive pattern form a group of bipolar transistors with the base terminal of each of said bipolar transistors being connected in common through said P conductivity type region; and wherein i. said MOS transistors and said bipolar transistors are interconnected by portions of said conductive patterns to form a display drive circuit.

7. An integrated circuit for driving display devices, comprising in combination:

a. a semiconductor substrate having a first region having N conductivity type which extends to the top and bottom surfaces of said substrate and a second region having P conductivity type which extends to at least one surface of said substrate;

b. an elongated strip-like region of semiconductor material having N+ conductivity type extending to the surface of said substrate and within said second region having P conductivity type;

c. a plurality of substantially rectangular regions of semiconductor material having N+ conductivity type and disposed adjacent said strip-like region and extending to the surface of said substrate;

d. a plurality of regions of semiconductor material within said region of N conductivity type, said plurality of regions having P+ conductivity type and extending to one surface of said substrate;

e. a thin insulating layer selectively covering the surface of said substrate;

f. a pattern of electrically conductive leads covering said insulating layers and said substrate; wherein g. said strip-like regions of semiconductor material having N+ conductivity type in conjunction with said substantially rectangular regions of semiconductor material having N+ conductivity type and portions of said insulating layer and portions of said conductive pattern form a plurality of MOS transistors with the source terminals of said MOS transistors connected in common; and wherein h. said regions of P+ conductivity type in conjunction with portions of said insulating layer and portions of said conductive pattern form a group of bipolar transistors with the base terminal of each of said bipolar transistors being connected in common through said P conductivity type region; and wherein i. said MOS transistors and said bipolar transistors are interconnected by portions of said conductive patterns to form a display drive circuit.

8. A display driver in accordance with claim 5 wherein the drain terminals of said MOS transistors are connected to a duty cycle modulation source.

9. A driver circuit comprising a semiconductor body having therein a first substrate region of P conductivity type and a second substrate region of N conductivity type, said second substrate region having therein at least two spaced apart regions of P+ conductivity type, with one of said P+ regions provided in an elongated strip-like configuration, said first substrate region having therein at least two spaced apart regions of N+ conductivity type circumscribed by a third N+ conductivity type region to thereby provide a guard ring therearound, said semiconductor body having a thin insulating layer with openings therein on at least one surface thereby selectively covering and selectively exposing portions of said region of P+ and N+ conductivity type, and an electrically conductive patterned layer selectively contacting said regions of P+ and N+ conductivity type and overlying portions of P+ and N+ conductivity regions to thereby form a driver circuit.

* * * * *